(12) United States Patent
Biar et al.

(10) Patent No.: US 7,737,452 B2
(45) Date of Patent: Jun. 15, 2010

(54) LIGHT-EMITTING ELEMENT PACKAGE AND LIGHT SOURCE APPARATUS USING THE SAME

(76) Inventors: Jin-Chyuan Biar, 4F. No. 5, Alley 6, Lane 394, Chung-Chen N, Rd., San Chung City, Taipei Hsien (TW); Chih-Kung Huang, 6F.-4, No. 82, Dasyue Rd., East District, Hsinchu City (TW) 300; Jue E-Yin Huang, No. 85, Alley 2, Lane 576, Sec. 1, Guangfu Rd., East District, Hsinchu (TW) 300

( * ) Notice: Subject to any disclaimer, the term of this patent is extended or adjusted under 35 U.S.C. 154(b) by 251 days.

(21) Appl. No.: 11/962,127

(22) Filed: Dec. 21, 2007

(65) Prior Publication Data

US 2008/0265271 A1    Oct. 30, 2008

(30) Foreign Application Priority Data

Apr. 30, 2007    (TW) .............................. 96115254 A

(51) Int. Cl.
*H01L 29/18* (2006.01)

(52) U.S. Cl. ........................... 257/88; 257/99; 257/100; 257/E33.066; 257/E33.077

(58) Field of Classification Search ..................... 257/3, 257/79–103, 918, E51.018–E51.022, E33.001–E33.077, 257/E33.054, E25.028, E25.032
See application file for complete search history.

(56) References Cited

U.S. PATENT DOCUMENTS

| 6,936,855 | B1 * | 8/2005 | Harrah .......................... 257/88 |
| 7,262,438 | B2 * | 8/2007 | Mok et al. ..................... 257/98 |
| 2008/0303038 | A1 * | 12/2008 | Grotsch et al. ................ 257/88 |

* cited by examiner

*Primary Examiner*—Fernando L Toledo
*Assistant Examiner*—Mamadou Diallo
(74) *Attorney, Agent, or Firm*—Jianq Chyun IP Office

(57) ABSTRACT

A light-emitting element package including a heat conductive layer having a first surface and a second surface, a dielectric layer disposed on the first surface of the heat conductive layer and having an opening exposing the heat conductive layer, two electrodes disposed on the dielectric layer at a side far away from the heat conductive layer, a light-emitting element, and a transparent sealing layer. The light-emitting element is disposed in the opening, carried on the first surface of the heat conductive layer, and electrically coupled to the two electrodes. The transparent sealing layer encapsulates the light-emitting element, the heat conductive layer, and the two electrodes, and exposes part of the two electrodes and the second surface of the heat conductive layer.

37 Claims, 9 Drawing Sheets

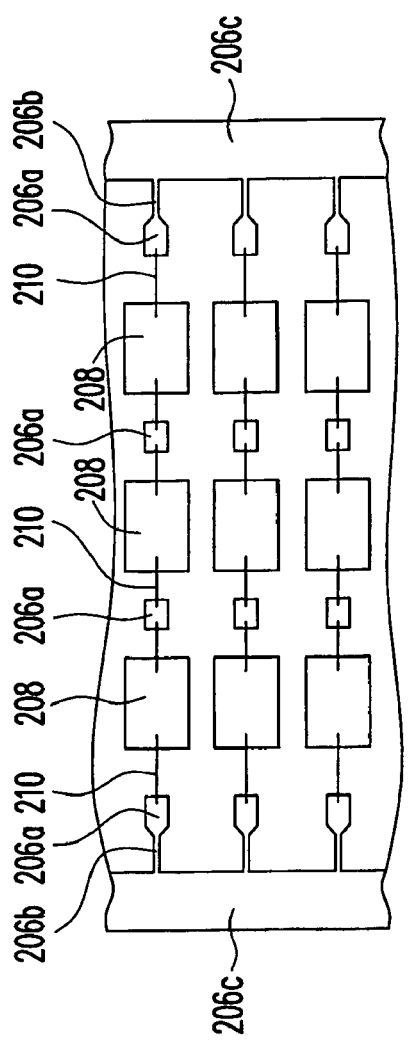
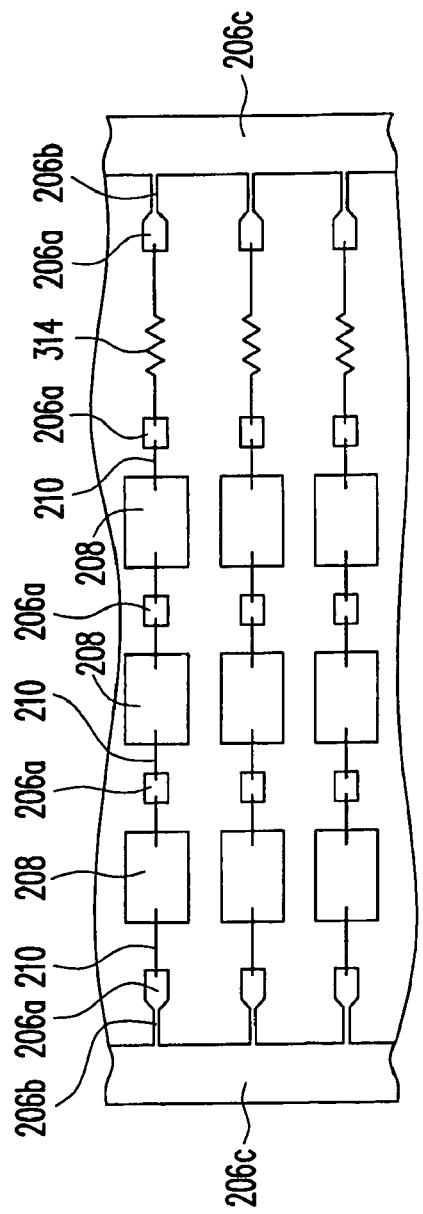

LIGHT-EMITTING ELEMENT PACKAGE AND LIGHT SOURCE APPARATUS USING THE SAME

CROSS-REFERENCE TO RELATED APPLICATION

This application claims the priority benefit of Taiwan application serial no. 96115254, filed on Apr. 30, 2007. The entirety of the above-mentioned patent application is hereby incorporated by reference herein and made a part of this specification.

BACKGROUND OF THE INVENTION

1. Field of the Invention

The present invention relates to a light-emitting element package. More particularly, the present invention relates to a light-emitting element package having separate layers for achieving heat and electrical conductive functions.

2. Description of Related Art

FIG. 1 is a structural view of a conventional LED package.

An LED 108 is attached onto a lead frame 102 by a silver paste 109, and is then electrically connected to an inner lead 102a of the lead frame 102 through a wire 110 by means of wire boding. Finally, a transparent sealing material 112 encapsulates the LED 108 and the wire 110, and exposes one surface of the lead frame 102.

The electrical conductive function of such package is achieved by the wire 110, the inner lead 102a and an outer lead 102b of the lead frame 102. The heat conductive function is achieved through the bottom of the LED 108 via the silver paste 109 and the lead frame 102. Electrical and heat conductive function are both achieved by the lead frame 102, and the main conductive area is limited at the portion of the lead frame right below the LED 108, so that the heat dissipating effect is not satisfactory.

SUMMARY OF THE INVENTION

As broadly embodied and described herein, the present invention is directed to a light-emitting element package, which includes a heat conductive layer having a first surface and a second surface; a dielectric layer disposed on the first surface of the heat conductive layer and having an opening exposing the heat conductive layer; two electrodes disposed on the dielectric layer at a side far away from the heat conductive layer; a light-emitting element disposed in the opening, carried on the first surface of the heat conductive layer, and electrically coupled to the two electrodes; and a transparent sealing layer encapsulating the light-emitting element, the heat conductive layer, and the two electrodes, and exposing part of the two electrodes and the second surface of the heat conductive layer.

Additionally, the present invention is directed to a light-emitting element package, which includes a heat conductive layer having a first surface and a second surface; a dielectric layer disposed on the first surface of the heat conductive layer and having a plurality of openings exposing the heat conductive layer; a plurality of connection pads disposed on the dielectric layer at a side far away from the heat conductive layer; a plurality of light-emitting elements disposed in the openings, carried on the first surface of the heat conductive layer, and electrically coupled to the connection pads; two electrodes disposed on the dielectric layer at a side far away from the heat conductive layer and respectively disposed at two outermost sides of the connection pads, and including a voltage electrode and a ground electrode, being elongated, and connecting the light-emitting elements in parallel; and a transparent sealing layer encapsulating the light-emitting elements, the heat conductive layer, the connection pad, and the two electrodes, and exposing part of the two electrodes and the second surface of the heat conductive layer.

Also, in the above light-emitting element package, the light-emitting elements are connected in series through the connection pads, and then connected in parallel through the electrodes.

Furthermore, the present invention is directed to a light source apparatus, which includes a model body constituting a profile of the light source apparatus, and at least one light-emitting element attached onto a surface of the model body.

In order to make the aforementioned and other objectives, features and advantages of the present invention comprehensible, preferred embodiments accompanied with figures are described in detail below.

It is to be understood that both the foregoing general description and the following detailed description are exemplary, and are intended to provide further explanation of the invention as claimed.

BRIEF DESCRIPTION OF THE DRAWINGS

The accompanying drawings are included to provide a further understanding of the invention, and are incorporated in and constitute a part of this specification. The drawings illustrate embodiments of the invention and, together with the description, serve to explain the principles of the invention.

FIG. 7 is a top view of FIG. 6 (a transparent sealing layer omitted).

FIG. 8 is a schematic view of a lighting element package according to a second embodiment of the present invention.

DESCRIPTION OF EMBODIMENTS

The First Embodiment

Referring to FIGS. 2-6, schematic views of packaging a lighting element according to a first embodiment of the present invention are shown.

Figure 1:
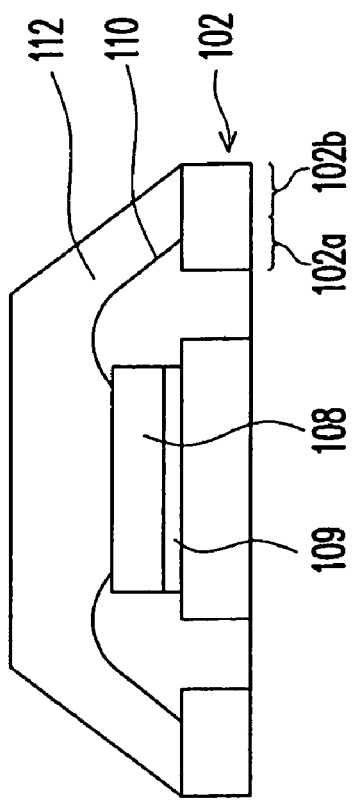
FIG. 1 shows a conventional LED package.
Figure 2:
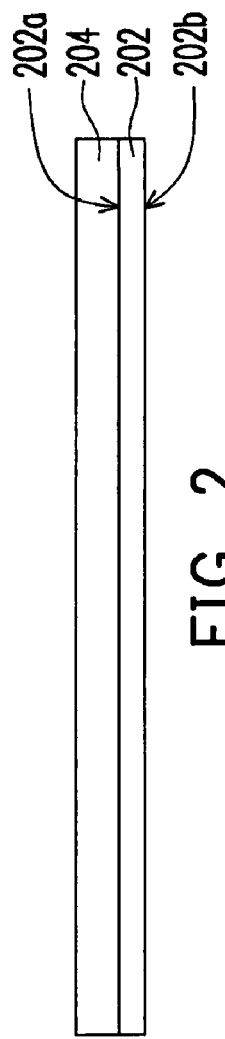
FIGS. 2-6 show schematic views of packaging a lighting element according to a first embodiment of the present invention.

First, referring to FIG. 2, a heat conductive layer 202, preferably a heat conductive layer having flexibility is provided, for example, a metal layer having a first surface 202a and a second surface 202b. Then, a dielectric layer 204 is formed on the first surface 202a of the heat conductive layer 202.

Figure 3:
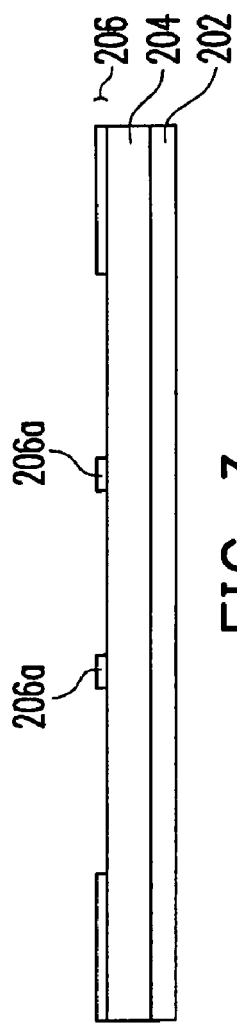

Referring to FIG. 3, a patterned conductive layer 206 is formed on the dielectric layer 204 at a side away from the heat conductive layer 202. The patterned conductive layer 206 has a plurality of connection pads 206a, a plurality of wires 206b, and two electrodes 206c (in FIG. 7). The two electrodes 206c are respectively disposed at two outermost sides of the connection pads and are elongated, wherein one is a voltage electrode and the other is a ground electrode. The wires 206b electrically couples the connection pads 206a to the electrodes 206c.

Figure 4:
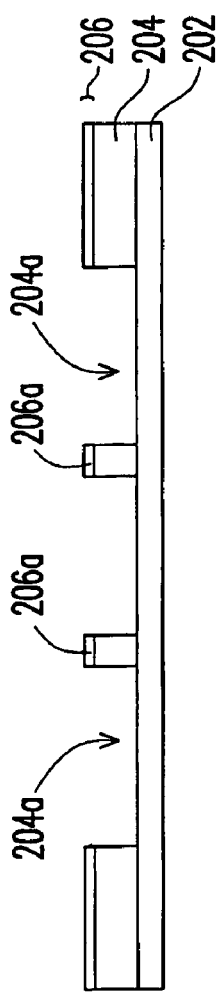

Referring to FIG. 4, a plurality of openings 204a are formed on the dielectric layer 204 for exposing the heat conductive layer 202.

Figure 5:
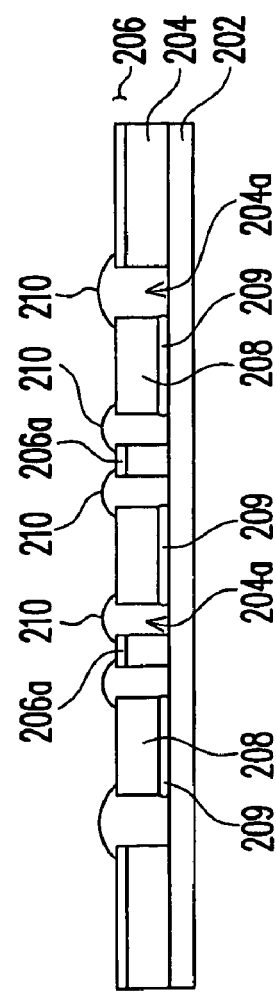

Referring to FIG. 5, a plurality of light-emitting elements 208, for example LEDs, is respectively disposed in the openings 204a, and is carried on the first surface 202a of the heat conductive layer 202 by a thermal conductive adhesive 209, e.g., a silver paste. The light-emitting elements 208 are electrically coupled to the connection pads 206a by a plurality of wires 210, for example, wires formed by means of wire bonding.

Figure 6:
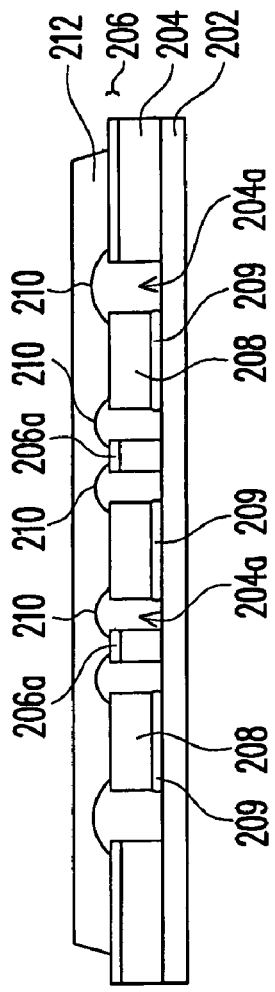

Referring to FIG. 6, the transparent sealing layer 212 encapsulates the light-emitting elements 208, the heat conductive layer 202, the connection pads 206a, and two electrodes 206c, and exposes part of the two electrodes 206c, and the second surface 202b of the heat conductive layer 202. Thus, the light-emitting element package is finished.

FIG. 7 is a top view of the package in FIG. 6 (the transparent sealing layer 212 omitted).

The coupling relationships of the connection pads 206a, the wires 206b, and the electrodes 206c can be clearly seen from FIG. 7. The electrodes 206c are electrically coupled with the light-emitting elements 208 in parallel. In detail, the light-emitting elements 208 are connected in series through the connection pads 206a, and then connected in parallel through the electrodes 206c.

The Second Embodiment

Referring to FIG. 8, a schematic view of a lighting element package according to a second embodiment of the present invention (a transparent sealing layer 212 omitted) is shown. Like element numerals are used to indicate like elements appearing in one or more of the figures, and the details will not be described herein again.

The difference between the second embodiment and the first embodiment is described as follows. The number of current limit resistors 314 is increased in the second embodiment. A plurality of the current limit resistors 314 is coupled with the ground electrodes 206c (one of the two electrodes 206c is used as the ground electrode) and the light-emitting element 208.

Definitely, the current limit resistors 314 can be designed according to practical requirements, and the current limit resistors can also be omitted.

The Third Embodiment

Figure 9:
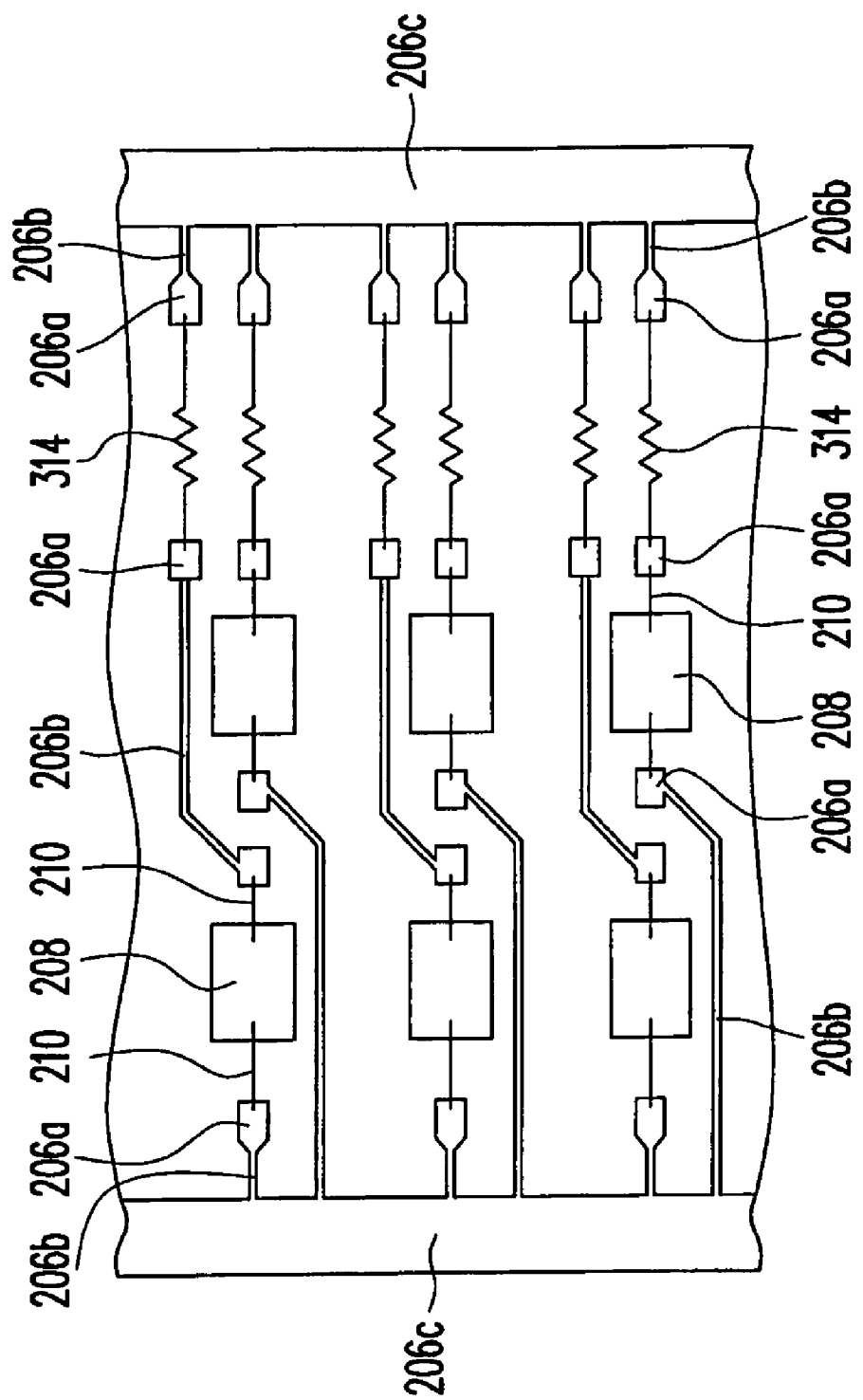
FIG. 9 is a schematic view of a lighting element package according to a third embodiment of the present invention.

Referring to FIG. 9, a schematic view of a light-emitting element package according to a third embodiment of the present invention (the transparent sealing layer 212 omitted) is shown. Like element numerals are used to indicate like elements appearing in one or more of the figures, and the details will not be described herein again.

The difference between the third embodiment and the second embodiment is the electrical connection manner. In FIG. 9, each light-emitting element 208 is connected with the current limit resistors 314 in series, and then connected in parallel through the electrodes 206c, and thus the light-emitting elements 208 are not connected in series.

Definitely, the light-emitting elements 208 are electrically coupled in a manner of series-parallel connection, or parallel connection, or a combination of series and parallel connection depending on the required circuit characteristics, which is illustrated as an example, but does not intend to limit the connection manner.

In the light-emitting element package according to the first embodiment and the third embodiment, the user can saw a segment of the package as required (the rows to be sawed are determined as required) to accomplish the required, packaged light-emitting element arranged in an array, for example, in an array of N(rows)×M(columns), where N and M are integers which can be the same or not.

Additionally, according to the spirit of the present invention, the light-emitting elements are not required to be arranged in an aligned array. But, the arrangement of the light-emitting elements can have many variations such as a pattern or a character depending on the circuit requirements and style requirements.

The Fourth Embodiment

Figure 10:
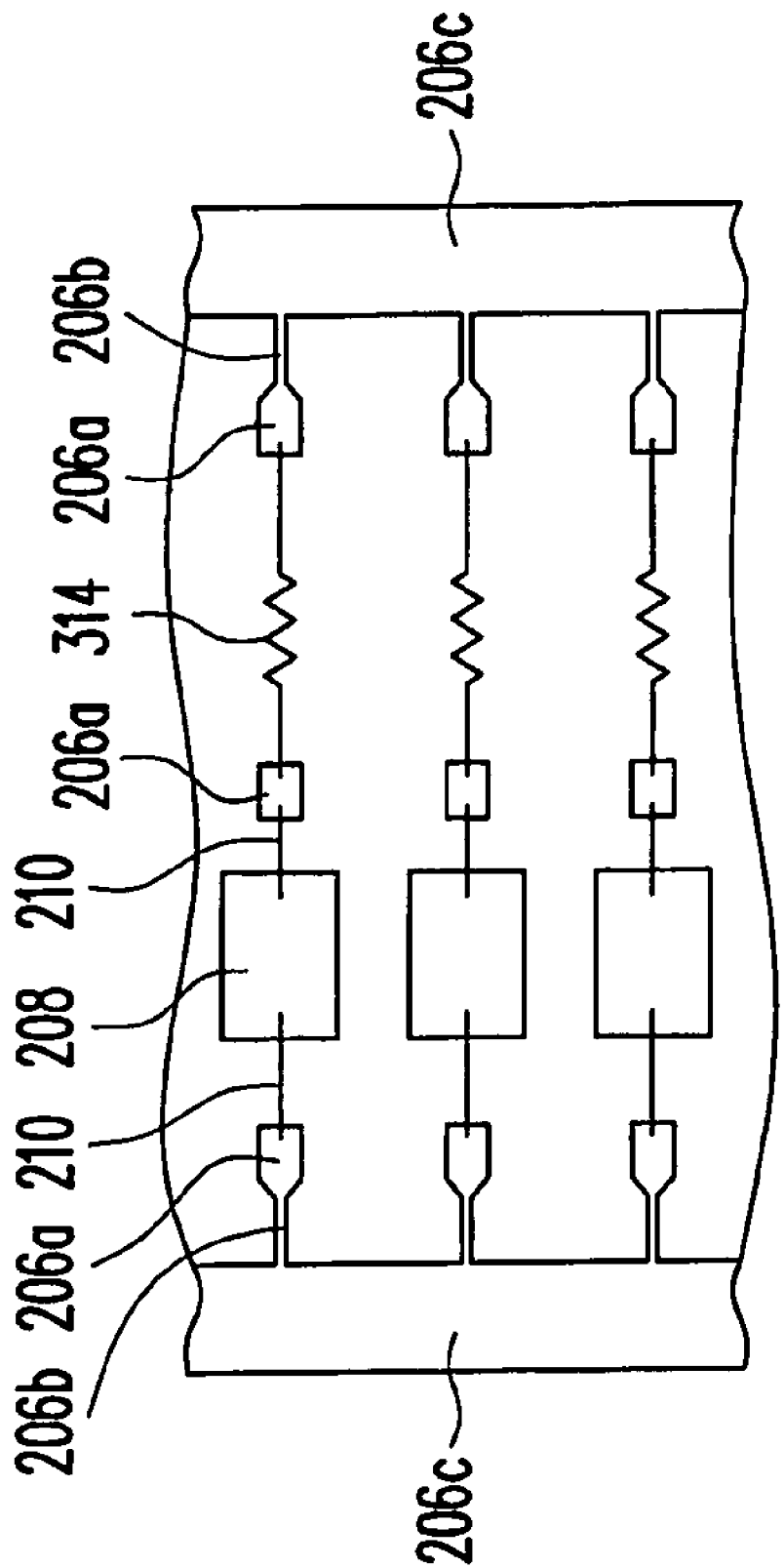
FIG. 10 is a schematic view of a lighting element package according to a fourth embodiment of the present invention.

Referring to FIG. 10, a top view of a light-emitting element package according to a fourth embodiment of the present invention (the transparent sealing layer 212 omitted) is shown. Like element numerals are used to indicate like elements appearing in one or more of the figures, and the details will not be described herein again.

The difference between the fourth embodiment and the above first to third embodiments is described as follows. The package of a plurality of light-emitting elements is obtained after sawing in the first to third embodiments, while the package of a plurality of light-emitting elements or a single light-emitting element can be obtained in the fourth embodiment.

If the package of a single light-emitting element is desired, the arrangement of the light-emitting element 208 in an array of N(row)×1 (column) as shown in FIG. 10 can be adopted. One light-emitting element 208 is connected in series with the current limit resistors 314 through the connection pads 206a respectively, and then connected in parallel through the electrodes 206c. The light-emitting element package in FIG. 10 is aligned with the elongated electrodes 206c, and the entire package is sawed in rows to obtain the package of a single light-emitting element.

Definitely, as described in the above embodiments, the current limit resistors are not necessarily required.

Figure 11:
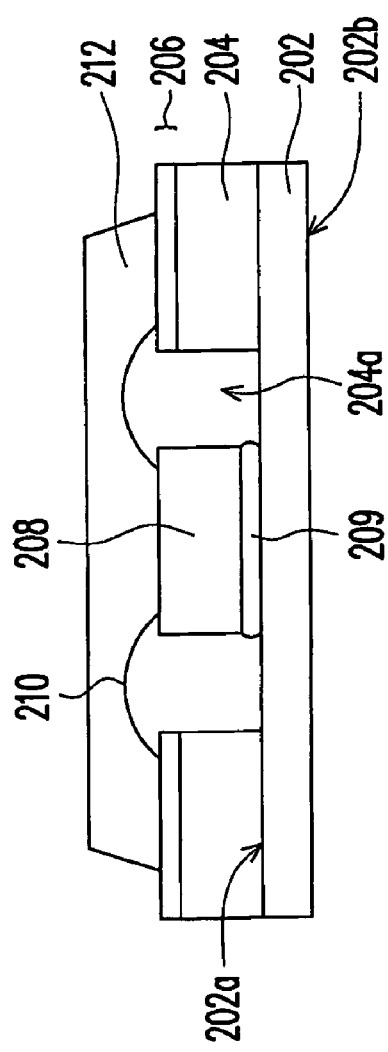
FIG. 11 is a cross-sectional view of a package of a single light-emitting element obtained subsequent to sawing the package in FIG. 10 (the current limit resistors omitted).
Figure 12:
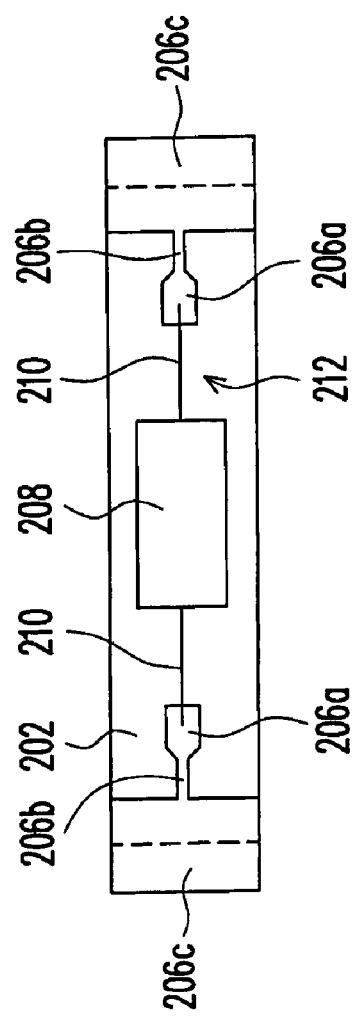
FIG. 12 is a top view of FIG. 11.

Then, referring to FIGS. 11 and 12, FIG. 11 is a cross-sectional view of a package of a single light-emitting element obtained by sawing a segment (sawing a row) of package in FIG. 10 (the current limit resistors omitted), and FIG. 12 is a top view of FIG. 11. The dash line in FIG. 12 indicates the boundary of the transparent sealing layer. Like element numerals are used to indicate like elements appearing in one or more of the figures, and the details will not be described herein again.

The obtained package of a single light-emitting element includes the heat conductive layer 202, the dielectric layer 204, the two electrodes 206c, the light-emitting element 208, and the transparent sealing layer 212.

The heat conductive layer 202 has the first surface 202a and the second surface 202b. The dielectric layer 204 is disposed on the first surface 202a of the heat conductive layer 202, and has an opening 204a exposing the heat conductive layer 202. The two electrodes 206c are disposed on the dielectric layer 204 at a side away from the heat conductive layer 202. The lighting element 208 is disposed in the opening 204a and carried on the first surface 202a of the heat conductive layer 202, and is electrically coupled to the two electrodes 206c.

The transparent sealing layer 212 encapsulates the lighting element 208, the heat conductive layer 202 and the two electrodes 206c, and exposes part of the two electrodes 206c and the second surface 202b of the heat conductive layer 202.

In the above first to fourth embodiments, the heat and electrical conductive functions are achieved by separate layers, thus avoiding affecting the characteristics of the light-emitting element. Since the conductive layer is disposed at the upper portion, and the heat conductive layer is disposed at the lower portion, and the entire light-emitting element package is attached onto one continuous sheet of metal, thus avoiding the problem of short circuit and even improving the heat dissipation performance.

Also, the series/parallel connection manners of the light-emitting elements are appropriately configured depending on the required circuit characteristics. The desired array configuration of the light-emitting element is obtained by sawing a segment of package (the rows to be sawed are determined as required), thus the degree of automation is high.

Although the light-emitting element in the above embodiment is, for example, LED, it should be understood from the spirit of the present invention that it is not limited to LED, and any element using electricity to emit light can be adopted as the light-emitting element to replace the above LED.

[Variations]

In the above embodiments, the transparent sealing layer 212 as shown has, but is not limited to, a convex surface. According to the spirit of the present invention, the transparent sealing layer 212 can also have a concave surface to converge the light to create different light-emitting effects. That is to say, the transparent sealing layer 212 made to have a convex or concave surface can have different light-emitting effects and produce different style designs.

Figure 13:
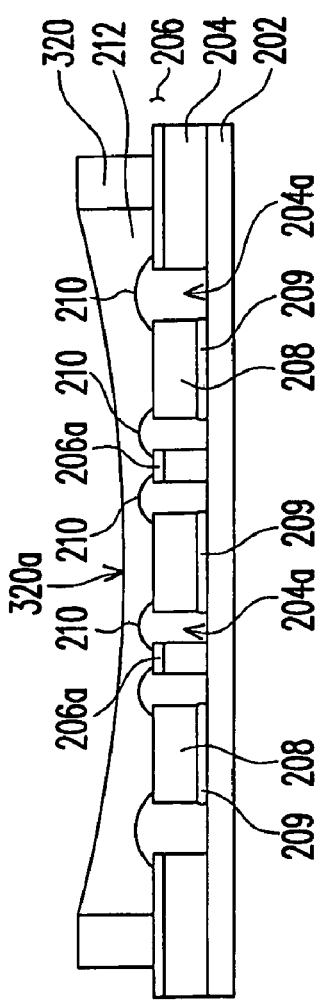
FIGS. 13 and 14 are cross-sectional views of the light-emitting element package according to variations of each embodiment of the present invention (the current limit resistors omitted).
Figure 14:
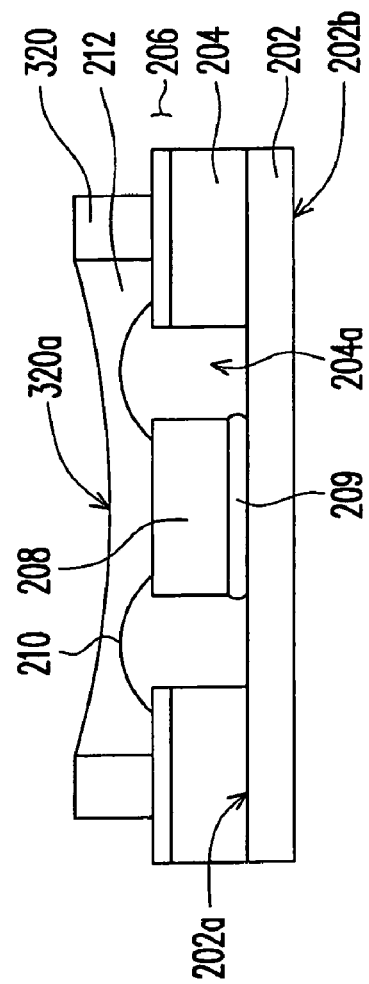

A variation of the embodiment of the present invention is illustrated with reference to FIGS. 13 and 14 as follows. Like element numerals are used to indicate like elements appearing in one or more of the figures, and the details will not be described herein again.

In order to make the surface of the transparent sealing layer 212 has various shapes, a dam 320 made of any material (transparent or opaque) can be formed before the transparent sealing layer 212 is formed on the conductive layer 206.

The dam 320 is substantially annular, and can also be of other shapes such as triangular, rectangular, polygonal, circular, and ellipsoidal as long as the periphery thereof is sealed and is able to surround the transparent sealing layer 212 to be filled therein, so as to prevent the transparent sealing layer 212 from spilling out and to expose the outermost portion of the conductive layer 206 to serve as the electrode 206c.

After the dam 320 is formed, the transparent sealing layer 212 is filled in, and a concave surface 320a is formed by the adhesion force between the dam 320 and the transparent sealing layer 212.

In the above embodiments and variations, the entire package is flexible by using the heat conductive layer having flexibility. Also, as the curvature of the curling is in direct proportion to (1/thickness), the a greater extent of curling can be obtained by making the thickness of the flexible heat conductive layer thinner, for example be up to 50 μm. Therefore, the above structure can be curled or bent as required, and can be attached onto different model bodys to form light source apparatus of different styles. Also, different light-emitting effects can be achieved by using the convex surface or concave surface of the transparent sealing layer.

Hereinafter, the embodiment of the light source apparatus using the present invention is described.

The Fifth Embodiment

Figure 15:
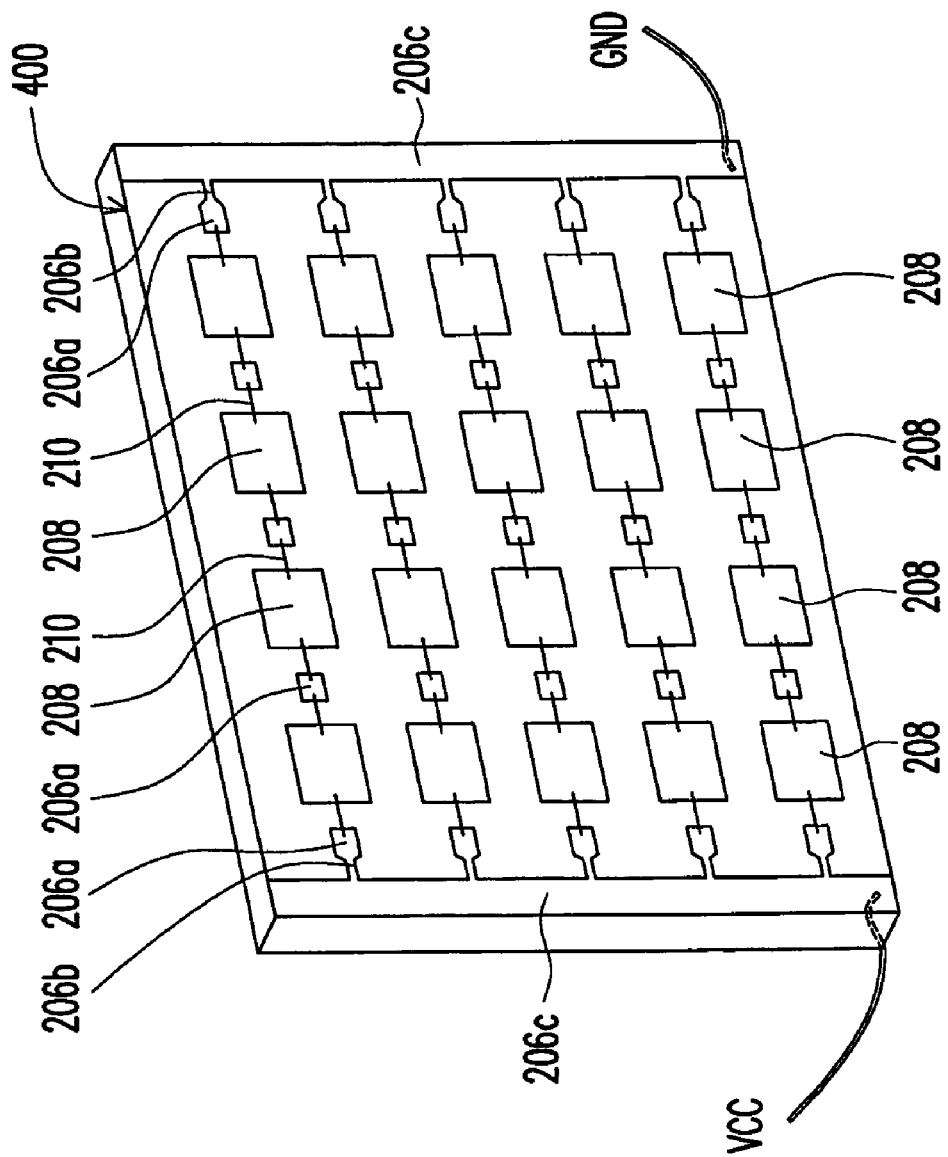
FIG. 15 is a schematic view of a light source apparatus according to a fifth embodiment of the present invention.

Referring to FIG. 15, a light source apparatus according to a fifth embodiment of the present invention is shown. Like element numerals are used to indicate like elements appearing in one or more of the figures, and the details will not be described herein again.

The model body 400 constitutes a profile of the light source apparatus and can be of a plane shape or a three-dimensional shape, which is, for example, a flat plate in FIG. 15. Any one or a combination of the light-emitting element package in the above first to fourth embodiments is attached onto the surface of the model body 400. Thus, a light source apparatus having different styles can be constituted.

In detail, in the case when the size of the model body 400 requires the light-emitting elements 5(rows)×4(columns) to be configured thereon, the package in the above first to third embodiments can be made into an array having four light-emitting elements in one row. Then 5 rows of the above light-emitting element are sawed from the electrode 206c as a whole and attached onto the model body 400. Then, one of the two electrodes 206c is used as a voltage electrode to connect to an appropriate voltage supply VCC, and the other electrode is used as a ground electrode to connect to the ground terminal GND, so that the connection configuration is simplified.

Definitely, the sawing can also be made by more than one time according to the circuit layout or style requirements. For example, a multiple sawing and a subsequent attaching are allowed, e.g. sawing into 2×4 and 3×4 and then attaching.

Also, if the style is complicated, for example, an art craft or special pattern (plane or three-dimensional) is fabricated, a plurality of packages of single light-emitting element package in the fourth embodiment can be used to be attached onto the surface of the model body one by one.

The Sixth Embodiment

Figure 16:
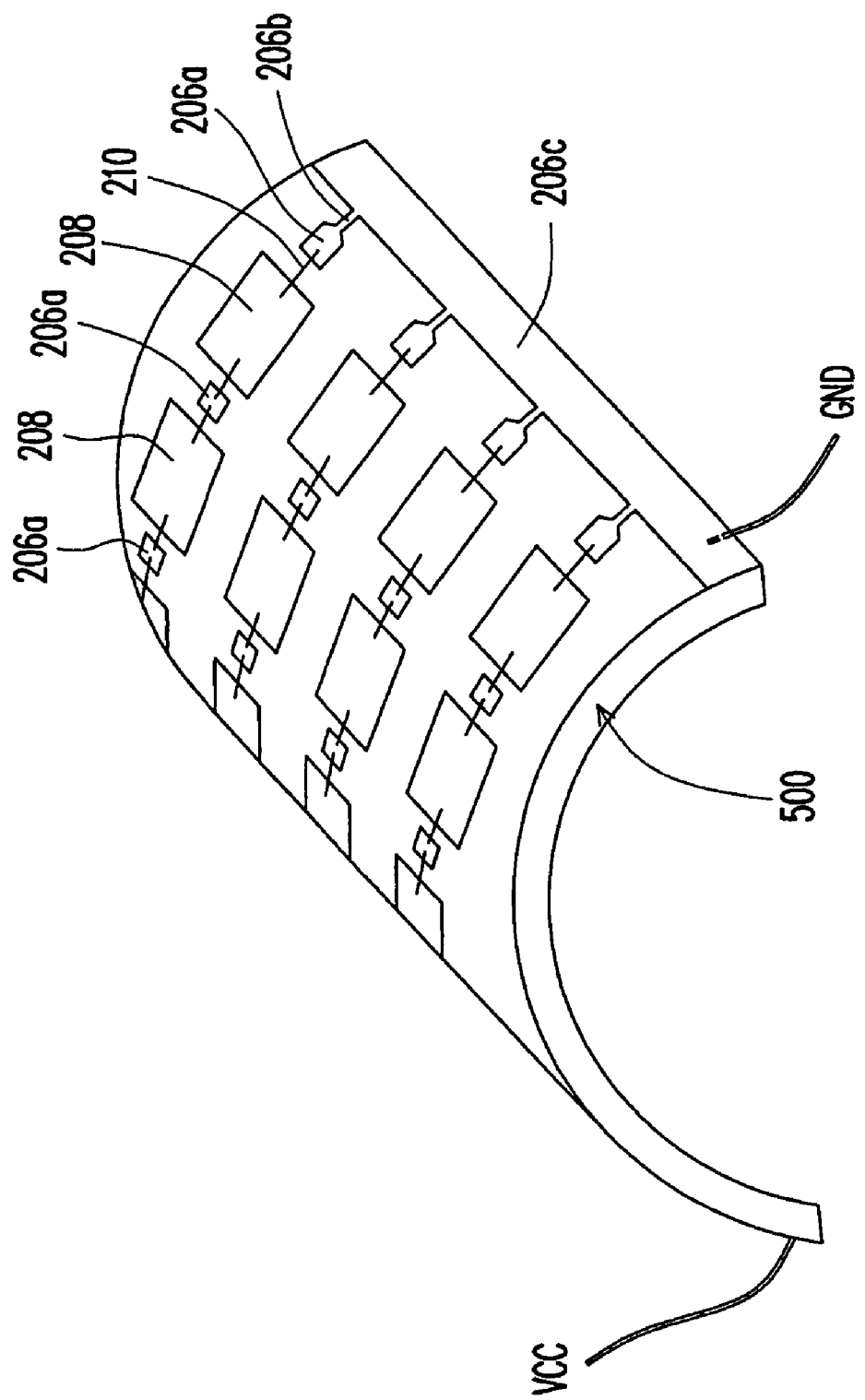
FIG. 16 is a schematic view of a light source apparatus according to a sixth embodiment of the present invention.

Referring to FIG. 16, a light source apparatus according to a sixth embodiment of the present invention is shown.

The difference between the sixth embodiment and the fifth embodiment lies in that the model body 500 in the sixth embodiment is of a three-dimensional shape.

It can be known from the above fifth and sixth embodiments that the light-emitting element package having different array configurations is sawed depending on different styles, and then combined to constitute various light source apparatus, thus the style combinations can be changed easily.

Also, if the model body is a metal or has a metal surface, the heat dissipation performance can be further improved.

It will be apparent to those skilled in the art that various modifications and variations can be made to the structure of the present invention without departing from the scope or spirit of the invention. In view of the foregoing, it is intended that the present invention cover modifications and variations of this invention provided they fall within the scope of the following claims and their equivalents.

What is claimed is:

1. A light-emitting element package, comprising:
   a heat conductive layer, which is a metal layer, having a first surface and a second surface;
   a dielectric layer, disposed on the first surface of the heat conductive layer, and having a plurality of openings exposing the heat conductive layer;
   an electrical conductive layer, disposed on the dielectric layer, and the electrical conductive layer and the heat conductive layer are respectively disposed at two opposite sides of the dielectric layer, wherein the electrical conductive layer comprises a plurality of connection pads and two electrodes, disposed at outermost sides of the connection pads;
   a plurality of light-emitting elements, disposed in the openings, carried on the first surface of the heat conductive layer, and electrically coupled to the connection pads and electrically coupled to the two electrodes through the connection pads; and
   a transparent sealing layer, encapsulating the light-emitting elements, the heat conductive layer, the connection pads, and the two electrodes, and exposing a part of the two electrodes and the second surface of the heat conductive layer.

2. The light-emitting element package as claimed in claim 1, wherein the light-emitting elements comprises LEDs.

3. The light-emitting element package as claimed in claim 1, further comprising a plurality of wires electrically coupling the light-emitting elements and the two electrodes.

4. The light-emitting element package as claimed in claim 1, further comprising a current limit resistor coupled between the light-emitting element and one of the two electrodes.

5. The light-emitting element package as claimed in claim 1, further comprising a dam structure disposed on the two electrodes, surrounding the transparent sealing layer, and exposing an outermost portion of the two electrodes.

6. The light-emitting element package as claimed in claim 1, wherein the transparent sealing layer has a concave surface.

7. The light-emitting element package as claimed in claim 1, further comprising a thermal conductive adhesive located between the light-emitting elements and the heat conductive layer.

8. The light-emitting element package as claimed in claim 7, wherein the thermal conductive adhesive comprises a silver paste.

9. A light-emitting element package, comprising:
   a heat conductive layer, which is a metal layer, having a first surface and a second surface;
   a dielectric layer, disposed on the first surface of the heat conductive layer, and having a plurality of openings exposing the heat conductive layer;
   an electrical conductive layer, disposed on the dielectric layer, and the electrical conductive layer and the heat conductive layer are respectively disposed at two opposite sides of the dielectric layer, wherein the electrical conductive layer comprises a plurality of connection pads and two electrodes, disposed at outermost sides of the connection pads;
   a plurality of light-emitting elements, disposed in the openings, carried on the first surface of the heat conductive layer, and electrically coupled to the connection pads, and electrically coupled to the two electrodes through the connection pads, wherein the two electrodes comprises a voltage electrode and a ground electrode, being elongated, and connecting the light-emitting elements in parallel; and
   a transparent sealing layer, encapsulating the light-emitting elements, the heat conductive layer, the connection pad, and the two electrodes, and exposing a part of the two electrodes and the second surface of the heat conductive layer.

10. The light-emitting element package as claimed in claim 9, wherein the heat conductive layer has flexibility.

11. The light-emitting element package as claimed in claim 9, wherein the light-emitting elements comprise LEDs.

12. The light-emitting element package as claimed in claim 9, further comprising a plurality of wires electrically coupling the light-emitting elements and the connection pads, and electrically coupling the connection pads and the two electrodes.

13. The light-emitting element package as claimed in claim 9, further comprising a plurality of current limit resistors coupled between the ground electrode and the light-emitting elements.

14. The light-emitting element package as claimed in claim 9, further comprising a dam structure disposed on the two electrodes, surrounding the transparent sealing layer, and exposing an outermost portion of the two electrodes.

15. The light-emitting element package as claimed in claim 9, wherein the transparent sealing layer has a concave surface.

16. The light-emitting element package as claimed in claim 9, further comprising a thermal conductive adhesive located between the light-emitting elements and the heat conductive layer.

17. The light-emitting element package as claimed in claim 16, wherein the thermal conductive adhesive comprises a silver paste.

18. The light-emitting element package as claimed in claim 9, the light-emitting elements are connected in series through the connection pads, and then connected in parallel through the electrodes.

19. The light-emitting element package as claimed in claim 18, wherein the light-emitting elements comprise LEDs.

20. The light-emitting element package as claimed in claim 18, further comprising a plurality of wires electrically coupling the light-emitting elements and the connection pads, and electrically coupling the connection pads and the two electrodes.

21. The light-emitting element package as claimed in claim 18, further comprising a plurality of current limit resistors coupled between the ground electrode and the light-emitting elements.

22. The light-emitting element package as claimed in claim 18, further comprising a dam structure disposed on the two electrodes, surrounding the transparent sealing layer, and exposing an outermost portion of the two electrodes.

23. The light-emitting element package as claimed in claim 18, wherein the transparent sealing layer has a concave surface.

24. The light-emitting element package as claimed in claim 18, further comprising a thermal conductive adhesive located between the light-emitting elements and the heat conductive layer.

25. The light-emitting element package as claimed in claim 24, wherein the thermal conductive adhesive comprises a silver paste.

26. A light source apparatus, comprising:
   a model body, constituting a profile of the light source apparatus; and
   at least one light-emitting element package as claimed in claim 1, attached onto a surface of the model body.

27. The light source apparatus as claimed in claim 26, wherein the model body is a flat plate.

28. The light source apparatus as claimed in claim 26, wherein the model body is a three-dimensional shape.

29. The light source apparatus as claimed in claim 26, wherein a material of the model body comprises metal.

30. A light source apparatus, comprising:
   a model body, constituting a profile of the light source apparatus; and
   light-emitting element package as claimed in claim 9, attached onto a surface of the model body.

31. The light source apparatus as claimed in claim 30, wherein the model body is a flat plate.

32. The light source apparatus as claimed in claim 30, wherein the model body is a three-dimensional shape.

33. The light source apparatus as claimed in claim 30, wherein a material of the model body comprises metal.

34. A light source apparatus, comprising:
   a model body, constituting a profile of the light source apparatus; and
   light-emitting element package as claimed in claim 18, attached onto a surface of the model body.

35. The light source apparatus as claimed in claim 34, wherein the model body is a flat plate.

36. The light source apparatus as claimed in claim 34, wherein the model body is a three-dimensional shape.

37. The light source apparatus as claimed in claim 34, wherein a material of the model body comprises metal.

* * * * *